(12) United States Patent
Park

(10) Patent No.: US 8,049,289 B2
(45) Date of Patent: Nov. 1, 2011

(54) IMAGE SENSOR AND METHOD FOR MANUFACTURING THE SAME

(75) Inventor: Seung Ryong Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 246 days.

(21) Appl. No.: 12/248,758

(22) Filed: Oct. 9, 2008

(65) Prior Publication Data

US 2009/0096050 A1 Apr. 16, 2009

(30) Foreign Application Priority Data

Oct. 11, 2007 (KR) ............... 10-2007-0102352
Sep. 4, 2008 (KR) ............... 10-2008-0087380

(51) Int. Cl.
*H01L 31/0232* (2006.01)
*H01L 31/18* (2006.01)
(52) U.S. Cl. ............ 257/432; 257/E31.127; 438/7
(58) Field of Classification Search .......... 257/432
See application file for complete search history.

(56) References Cited

U.S. PATENT DOCUMENTS

| | | | |
|---|---|---|---|
| 6,606,198 B2 | 8/2003 | Sasano et al. | |
| 7,307,788 B2 | 12/2007 | Boettiger et al. | |
| 7,842,909 B2 * | 11/2010 | Dunne et al. | 250/208.1 |
| 2001/0036014 A1 | 11/2001 | Sasano et al. | |
| 2006/0027887 A1 * | 2/2006 | Boettiger et al. | 257/432 |
| 2006/0119950 A1 * | 6/2006 | Boettiger et al. | 359/626 |
| 2006/0138498 A1 * | 6/2006 | Kim | 257/294 |

FOREIGN PATENT DOCUMENTS

| | | |
|---|---|---|
| FR | 2006/002581 | * 11/2006 |
| JP | 2000-206310 | 7/2000 |
| KR | 10-2007-0086918 A | 8/2007 |

OTHER PUBLICATIONS

Ulrich C. Boettiger and Jin Li; "Gapless Microlens Array and Method of Fabrication"; Korean Patent Abstracts; Publication No. 1020070086918 A; Publication Date: Aug. 27, 2007; Korean Intellectual Property Office, Republic of Korea.
Korean Office Action dated Mar. 24, 2009; Korean Patent Application No. 10-2007-0102352; Korean Intellectual Property Office, Republic of Korea.
Korean Office Action; Korean Patent Application No. 10-2008-0087380; Publication Date: Jun. 7, 2010; Korean Intellectual Property Office, Republic of Korea.
Sasano Tomohiko, Tanaka Yasuhiro, Yamagata Michihiro, Sano Yoshikazu, Otagaki Tomoko, Ichikawa Michiyo, Terakawa Sumio, and Aoki Hiromitsu; "Lens Array"; Patent Abstracts of Japan; Publication No. 2000-206310; Publication Date: Jul. 28, 2000; http://www19.ipdl.inpit.go.jp.

* cited by examiner

*Primary Examiner* — Jarrett Stark
*Assistant Examiner* — Lawrence Tynes, Jr.
(74) *Attorney, Agent, or Firm* — The Law Offices of Andrew D. Fortney; Andrew D. Fortney

(57) ABSTRACT

Disclosed are an image sensor and a method for manufacturing the same. The image sensor includes a semiconductor substrate including a unit pixel, first to third color filters provided on the semiconductor substrate, a first micro-lens provided on each of the first and third color filters, and a second micro-lens provided on the second color filter, in which an outer periphery of the first micro-lens has a square shape, and an upper portion of the first micro-lens has a semi-spherical or convex shape.

17 Claims, 8 Drawing Sheets

IMAGE SENSOR AND METHOD FOR MANUFACTURING THE SAME

The present application claims priority under 35 U.S.C. 119 to Korean Patent Application No. 10-2007-0102352 (filed on Oct. 11, 2007) and Korean Patent Application No. 10-2008-0087380 (filed on Sep. 4, 2008), each of which is hereby incorporated by reference in its entirety.

BACKGROUND

Embodiments of the invention relate to an image sensor and a method for manufacturing the same.

An image sensor is a semiconductor device that converts an optical image into electric signals. The image sensor is mainly classified into a charge coupled device (CCD) image sensor and a complementary metal oxide silicon (CMOS) image sensor (CIS).

The CMOS image sensor includes a photodiode and a MOS transistor in each unit pixel, and sequentially detects the electric signals of each unit pixel in a switching mode to realize images.

In the CMOS image sensor, as a design rule is gradually reduced, the size of the unit pixel can be reduced, but the photosensitivity of the photodiode is also reduced. In order to enhance the photosensitivity of such an image sensor, a micro-lens is formed on a color filter. The micro-lens may be formed in a semi-spherical shape by performing an exposure process, a development process, and a reflow process on a photosensitive organic material. The micro-lens should have an optimal size, thickness, and radius of curvature depending of the size and the position of each unit pixel.

SUMMARY

Embodiments of the invention provide an image sensor and a method for manufacturing the same, capable of improving light condensing efficiency without the loss of a fill-factor by forming a micro-lens having a spherical top surface and a square-shape outer peripheral surface when a double lens is formed.

According to various embodiments, an image sensor may include a semiconductor substrate including a plurality of unit pixels, first to third color filters on or over the semiconductor substrate, a first micro-lens provided on or over at least one of the first and third color filters, and a second micro-lens on or over the second color filter, in which an outer peripheral surface of the first micro-lens has a square shape (e.g., substantially vertical sidewalls), and an upper portion of the first micro-lens has a semi-spherical (or convex) shape.

According other embodiments, a method for manufacturing an image sensor may include the steps of forming or defining a plurality of unit pixels on a semiconductor substrate, forming first to third color filters on or over the semiconductor substrate, forming a first micro-lens on or over at least one of the first and third color filters, and forming a second micro-lens on or over the second color filter, wherein an outer peripheral surface of the first micro-lens has a square shape (e.g., substantially vertical sidewalls), and an upper portion of the first micro-lens has a semi-spherical or convex shape.

DETAILED DESCRIPTION OF THE EMBODIMENTS

An exemplary image sensor and a method for manufacturing the same according to embodiments of the present invention will be described with reference to accompanying drawings.

First Embodiment

Hereinafter, an exemplary image sensor and an exemplary method for manufacturing the image sensor according to a first embodiment will be described with reference to FIGS. 1 to 7.

Figure 6:
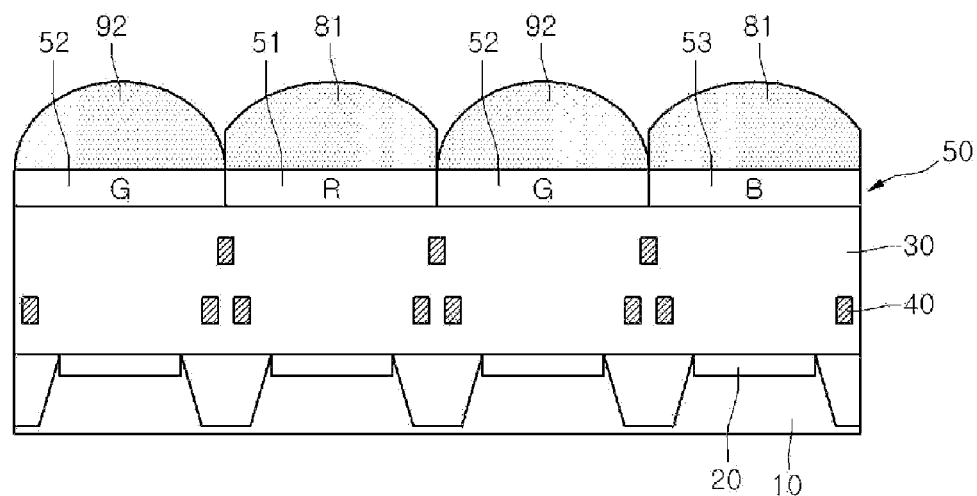
Figure 7:
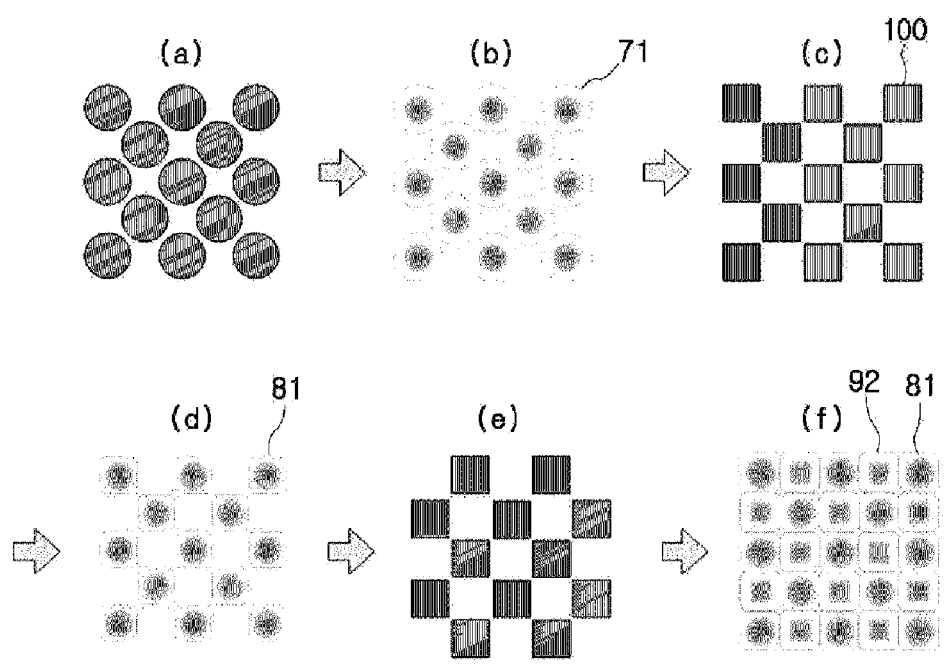
FIG. 7 is a plan view showing exemplary microlens shapes made by the exemplary manufacturing process according to the first embodiment.

FIG. 6 is a cross-sectional view showing the exemplary image sensor according to the first embodiment.

Referring to FIG. 6, a color filter array 50 including first to third color filters 51, 52, and 53 is provided on a semiconductor substrate 10 including a plurality of individual unit pixels 20. Each unit pixel 20 on the semiconductor substrate 10 may include a photodiode and a CMOS circuit (e.g., comprising a reset transistor, a select transistor, a drive transistor, and an optional transfer transistor).

An interlayer dielectric layer 30 and a metal interconnection 40 are provided on the semiconductor substrate 10. Generally, the interlayer dielectric layer 30 comprises a plurality of dielectric layers (not shown), each of which may independently comprise a lowermost etch stop layer (e.g., silicon nitride) one or more conformal and/or gap-fill dielectric layers (e.g., TEOS, plasma silane, or silicon-rich oxide), one or more bulk dielectric layers (e.g., silicon oxycarbide [SiOC], which may be hydrogenated [e.g., SiOCH]; undoped silicon dioxide [e.g., USG or a plasma silane]; or silicon dioxide doped with fluorine [e.g., FSG] or boron and/or phosphorous [e.g., BSG, PSG, or BPSG]), and/or one or more cap layers (e.g., TEOS, USG, plasma silane, etc.). Each metal interconnection 40 may independently comprise one or more lowermost adhesive and/or diffusion barrier layers (e.g., titanium, titanium nitride, tantalum, tantalum nitride, etc., such as a titanium nitride-on-titanium bilayer), a bulk conductive layer (e.g., aluminum, an aluminum alloy [e.g., Al with from 0.5 to 4 wt. % Cu, up to 2 wt. % Ti, and/or up to 1 wt. % Si], or copper), and/or one or more uppermost adhesive, hillock prevention and/or antireflective coating layers (e.g., titanium, titanium nitride, titanium tungsten alloy, etc., such as a titanium nitride-on-titanium bilayer). The lowermost metal interconnection may be electrically connected to a source/drain terminal (e.g., of a transistor in the CMOS circuit) in the substrate 10 by a conventional tungsten plug or via, which may further include an adhesive and/or diffusion barrier layer (e.g., a titanium nitride-on-titanium bilayer) between it and the surrounding dielectric layer. An overlying metal interconnection 40 may be electrically connected to an underlying metal interconnection (e.g., the lowermost metal interconnection) by such a tungsten plug. Alternatively, metal interconnections 40 and the underlying plug or via may comprise a conventional dual damascene copper interconnection (which may further include an adhesive and/or diffusion barrier layer, such as a tantalum nitride-on-tantalum bilayer, and a seed layer such as sputtered copper, ruthenium or other metal, between it and the surrounding dielectric layer).

The first to third color filters 51, 52, and 53 of the color filter array 50 may be a red color filter, a green color filter, and a blue color filter, respectively. Alternatively, the first-third color filters may comprise yellow, blue and cyan color segments, respectively. In one variation, the second color filter 52 is generally located at sides of the first and/or third color filter 51 or 53, so that there are twice as many second color filters 52 as first color filters 51 or third color filters 53. Accordingly, since green colors, which correspond to the second color filter 52, are twice the number of red colors or blue colors, the photosensitivity of a photodiode can be improved.

In one variation, a first micro-lens 81 is provided on each first color filter 51 and/or third color filter 53 (preferably both the first color filters 51 and the third colors filter 53). The first micro-lens 81 may have an outer peripheral surface with a square shape (e.g., substantially vertical sidewalls) and a semi-spherical (e.g., convex) upper portion. For example, the first micro-lens 81 may have a lower portion with substantially vertical sidewalls and an outer periphery (when viewed from the top) having substantially straight segments. The height of the lower portion maybe, e.g., from 100 to 8000 nm, 500 to 5000 nm, or any other range of values between 100 and 8000 nm. The substantially straight segments of the outer periphery of the first micro-lenses 81 may constitute at least half of the entire outer periphery of the first micro-lenses 81.

A second micro-lens 92 is generally provided on each of the second color filters 52. The second micro-lens 92 may have a (substantially) circular outer peripheral surface and a semi-spherical (e.g., convex) upper portion.

The first micro-lens 81 on the first color filter 51 and/or the third color filter 53 generally has the same radius of curvature along the width, length, and diagonal directions of the microlens, so that the photosensitivity of the image sensor can be improved.

In the image sensor according to the first embodiment, the micro-lens on the blue and red color filters has a shape different from the micro-lens on the green color filter, so that a fill factor and photosensitivity of the image sensor can be improved.

Hereinafter, an exemplary method for manufacturing the image sensor according to the first embodiment will be described with reference to FIGS. 1 to 7.

Figure 1:
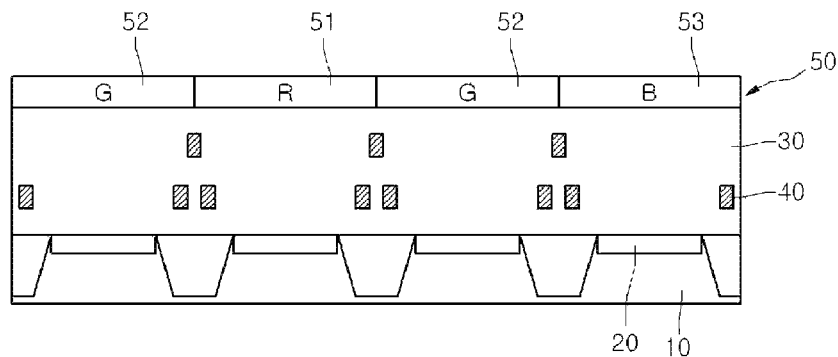
FIGS. 1 to 6 are cross-sectional views showing intermediate structures in an exemplary process of manufacturing an image sensor according to a first embodiment.

Referring to FIG. 1, a color filter array 50 is formed on the semiconductor substrate 10 including the unit pixels 20. First, an isolation layer is formed on or in the semiconductor substrate 10 to define an active region (or a plurality of active regions) and a field region (or a plurality of field regions). Each unit pixel 20 in the active region includes a photodiode, which receives light to generate optical charges, and a CMOS circuit, which is connected to the photodiode to convert the received optical charges into an electrical signal. The photodiode may be formed by masked ion implantation of an N-type dopant (e.g., phosphorous, arsenic, or antimony) at a first depth and a P-type dopant (e.g., boron) at a shallower depth and in a greater dose or concentration than the N-type dopant. The CMOS circuit includes the above-described transistors (including a gate oxide, a gate electrode, sidewall spacers and source/drain terminals) are formed by conventional CMOS processing.

After components related to the unit pixel 20 are formed, the metal interconnection(s) 40 and the interlayer dielectric layer 30 are formed on the semiconductor substrate 10. As described above, the interlayer dielectric layer 30 may include a plurality of layers. For example, the interlayer dielectric layer 30 may include a nitride layer and/or an oxide layer.

The metal interconnections 40 may be formed on a sublayer of the interlayer dielectric layer 30. The metal interconnection 40 may be laid out such that light incident onto the photodiode is not shielded (e.g., the metal interconnections 40 are not over the photodiode).

The interlayer dielectric layer 30 may further include a passivation layer. The passivation layer may include an insulating layer to protect a device from moisture or scratches. In one variation, the passivation layer is an uppermost layer of the dielectric layer 30. For example, the passivation layer may include a silicon oxide layer, a silicon nitride layer, a silicon oxynitride layer or a stacked structure comprising a plurality of layers (e.g., one or more silicon oxide layers, one or more silicon nitride layers, and/or one or more silicon oxynitride layers).

Meanwhile, a formation process of the passivation layer may be omitted, and the color filter array 50 may be formed on the interlayer dielectric layer 30 through the following process. This affects the height of the image sensor so that a slimmer image sensor can be realized. Accordingly, the manufacturing cost can be reduced according to the reduction of process steps.

The color filter array 50 is formed on the semiconductor substrate 10 including the interlayer dielectric layer 30. The color filter array 50 employs dyed photoresist, and each unit pixel 20 includes one color filter, so that colors are extracted or filtered from incident light.

The color filter array 50 represents various colors, and includes the first to third colors filters 51 to 53. For example, the first color filter 51, the second color filter 52, and the third color filter 53 may include a red color filter, a green color filter, and a blue color filter, respectively.

In particular, the number of the second color filters 52 may be about twice the number of the first color filters 51 or the third color filters 53 (and about equal to the sum of the first color filters 51 and the third color filters 53). Since the color filter array 50 has various sensitivities according to colors, and the human eye may be more sensitive to a green color than a red color or a blue color, the color filter array 50 includes more of the second color filters 52.

Accordingly, the second color filter 52 may be formed first, and then either the first color filter 51 or the third color filter (followed by the other of the first color filter 51 and the third color filter). The color filters are generally formed by spinning on a liquid composition of dye and photoresist in a solvent, then after the solvent is evaporated, the dyed photoresist may be lithographically patterned and developed. In other words, the first color filters 51 may be formed at first and second sides of the second color filter 52. In addition, the third color filters 53 may be formed at third and fourth sides of the second color filter 52.

Although not shown, a planar layer (e.g., comprising a transparent photoresist) may be formed on the color filter array 50. A micro-lens, which is formed in the following process, is preferably formed on a planarized surface. Accordingly, any step difference between color filters in the color filter array 50 should be removed.

Figure 2:
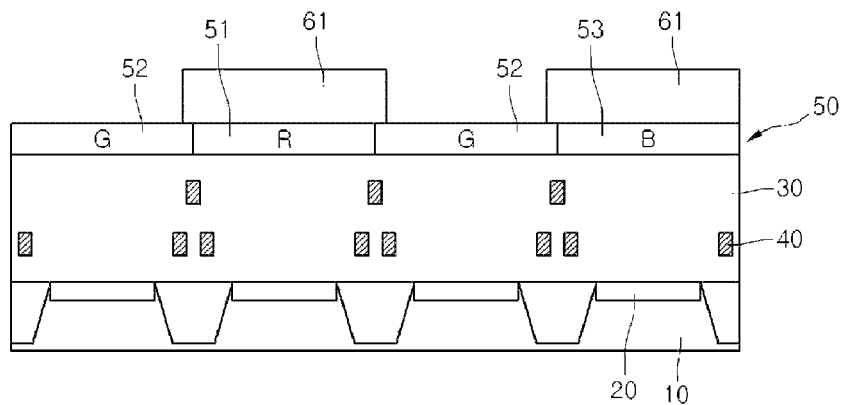

Referring to FIG. 2, a first seed pattern 61 is formed on the first color filter 51 and/or the third color filter 53. In order to form the first seed pattern 61, photoresist for a micro-lens is coated on the color filter array 50 through a spin process, thereby forming a photoresist film. Then, the photoresist film is exposed and developed, so that the first seed pattern 61 is formed on the first color filter 51 and/or the third color filter 53.

In particular, a mask used to form the first seed pattern 61 may be a circular mask as shown in FIG. 7A. Accordingly, the first seed pattern 61 may have the shape of a disk or circle having a uniform diameter. In addition, the first seed pattern 61 may be formed in a wider area than that of the first color filter 51 and/or the third color filter 53. In other words, the first seed pattern 61 formed on the first color filter 51 and/or the third color filter 53 may extend beyond the border of the second color filter 52.

Figure 3:
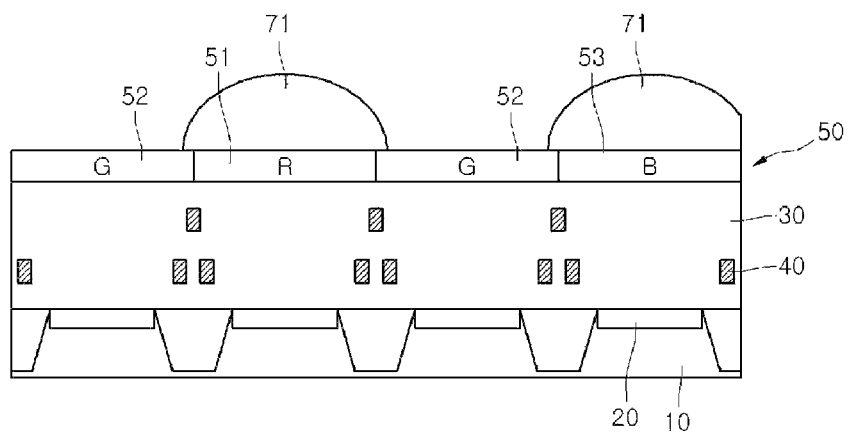

Referring to FIG. 3, a first lens pattern 71 is formed on the first color filter 51 or the third color filter 53. The first lens pattern 71 may be formed by performing a reflow process with respect to (e.g. reflowing or heating) the first seed pattern 61. Typical reflow temperatures range from about 100-120° C. to about 200-225° C. In other words, if the reflow process is performed with respect to the first seed pattern 61, a semi-spherical or curved first lens pattern 71 having a convex upper surface may be formed. In addition, since the first lens pattern 71 has a circular shape as shown in FIG. 7B, the first lens pattern 71 may have the same radius of curvature in the width, length, and diagonal directions.

The first lens pattern 71 on the first color filter 51 and/or the third color filter 53 may be formed in an area wider than an area of the first color filter 51 or the third color filter 53. Since the first seed pattern 61 sufficiently covers the upper portion of the first color filter 51 and/or the third color filter 53, the first lens pattern 71 may cover the first color filter 51 and/or the third color filter 53 even if the reflow process is performed with respect to the first seed pattern 61.

Figure 4:
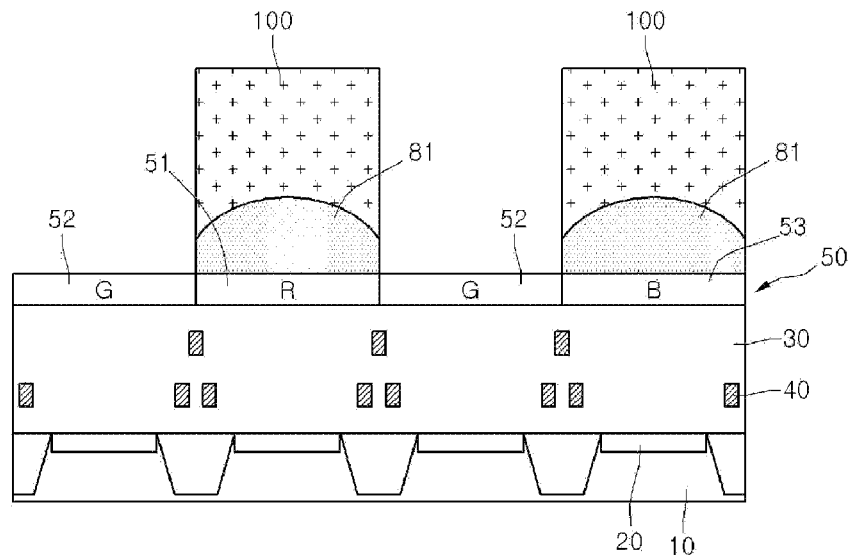

Referring to FIG. 4, the first micro-lens 81 is formed on the first color filter 51 and/or the third color filter 53. In order to form the first micro-lens 81, a photoresist pattern 100 is formed on the first lens pattern 71, the photoresist pattern 100 having a size corresponding to that of the first color filter 51 and/or the third color filter 53. The photoresist pattern 100 may have a size and a shape corresponding to the shape of the first color filter 51 and/or the third color filter 53 as shown in FIG. 7C. Then, the area of the first lens pattern 71 exposed by photoresist pattern 100 is removed by using the photoresist pattern 100 as an etching mask. Accordingly, as shown in FIG. 7D, the first micro-lens 81 may have a semi-spherical or convex upper portion and a square-shape outer peripheral surface.

When the micro-lens of the image sensor has the same radius of curvature in width, length, and diagonal directions, the photosensitivity of the image sensor can be improved. According to the first embodiment, the first micro-lens 81 may have a spherical-shape top surface and a square-shape outer peripheral surface. Accordingly, since the first micro-lens 81 has substantially the same radius of curvature in the width, length, and diagonal directions, the aberration is reduced (even though the width and/or length does not have the same value as the diagonal diameter), so that the photosensitivity of the image sensor can be improved.

Figure 5:
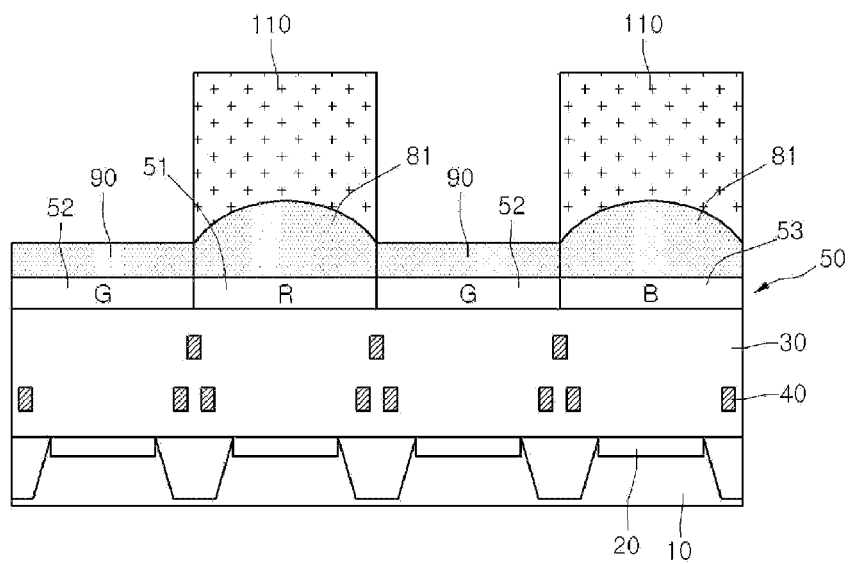

Referring to FIG. 5, a second seed pattern 90 is formed on the second color filter 52. In order to form the second seed pattern 90, photoresist for a micro-lens is coated on the color filter array 50 through a spin-on process, thereby forming a photoresist film. In this case, a protective mask 110 may be formed on the first micro-lens 81 to protect the surface of the first micro-lens 81. For example, the photoresist pattern 100 may be used as the protective mask 110. In addition, the protective mask 110 may be formed by pattering an oxide layer or a nitride layer onto the first microlenses 81.

Thereafter, the photoresist film is exposed and developed such that the second seed pattern 90 is formed on the second color filter 52. In particular, a mask used to form the second seed pattern 90 may have a square shape as shown in FIG. 7E. Accordingly, the second seed pattern 90 may have a square shape. In addition, since the second seed pattern 90 is formed on the color filter array 50 including the protective mask 110, the second seed pattern 90 may be formed only on the second color filter 52.

Referring to FIG. 6, a second micro-lens 92 is formed on the second color filter 52. The second micro-lens 92 may be formed through the reflow process, similar to the first seed pattern 80. When the reflow process is performed with respect to the second seed pattern 90, the second micro-lens 92 having a convex semi-spherical surface is formed.

Thereafter, the protective mask 110 is removed.

As shown in FIG. 7F, since the second micro-lens 92 has a semi-spherical or convex shape, and the number of the second micro-lenses 92 corresponds to the number of the first micro-lenses 81, the photosensitivity of the image sensor can be improved.

In the method for manufacturing the image sensor according to the first embodiment, the second micro-lenses 92 having a semi-spherical upper surface are formed on the second color filters 52, so that the fill factor of the image sensor can be improved. In addition, the first micro-lens 81 may formed on the first color filter 51 and the third color filter 53, and the second micro-lens 92 is formed on the second color filter 52, so that the photosensitivity of the image sensor can be improved. In other words, since the second micro-lenses 92 having a semi-spherical surface are formed on the second color filters 52 (in twice the number of the first color filters 51 or the third color filters 53), the photosensitivity is improved so that an image characteristic can be improved. This is because a green color represents or has sensitivity superior to that of the red color or the blue color, so that the sensitivity of the image sensor can be improved when a great number of the second color filters 52 and a great number of the second micro-lenses 92 are formed.

In addition, since the first micro-lens 81 having a semi-spherical surface and a square-shaped outer periphery is formed on the first and third color filters 51 and 53, the photosensitivity is improved, so that an image characteristic can be improved. That is, the shape of the first micro-lenses 81 may reduce aberration, so that sensitivity for the red color and the blue color can be selectively increased. Accordingly, the whole sensitivity of the image sensor can be enhanced.

However, the invention is not so limited. The first micro-lens 81 having a semi-spherical surface and a square-shaped outer periphery may be formed on the second color filters 52, or on only one of the first and third color filters 51 and 53. Additionally or alternatively, either the first or third color filter (e.g., red or blue) may be the color filter present in the same number as the sum of the other two color filters.

Second Embodiment

Hereinafter, an exemplary image sensor and an exemplary method for manufacturing the same according to a second embodiment will be described with reference to FIGS. 8 to 17. The second embodiment may employ many, most or all of the technical characteristics of the first embodiment. In addition, the same reference numbers will be assigned to components identical to those of the first embodiment.

Figure 16:
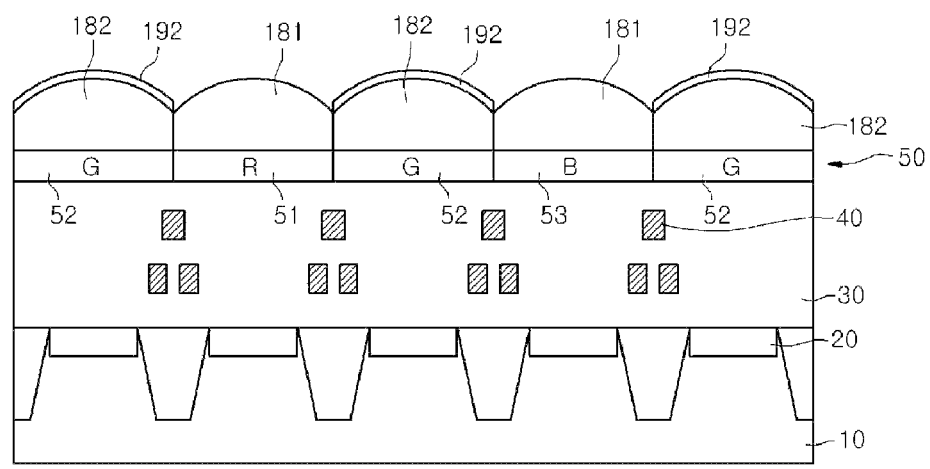
Figure 17:
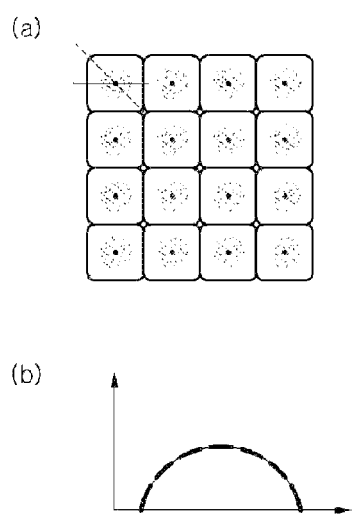
FIG. 17 is a plan view and an idealized cross-sectional view showing microlenses in the exemplary image sensor made according to the second embodiment.

FIG. 16 is a cross-sectional view showing an exemplary image sensor according to the second embodiment.

The exemplary image sensor according to the second embodiment includes a semiconductor substrate 10 including a plurality of unit pixels 20; a first color filter 51, a second color filter 52, and a third color filter 53 on the semiconductor substrate 10, each color filter corresponding to one of the unit pixels 20; a first micro-lens 181 on the first and third color filters 51 and 53; a second micro-lens 182 on the second color filter 52; and a coating pattern 192 on the surface of the second color filter 52. In this case, the first and second micro-lenses 181 and 182 have a convex spherical top surface and square-shaped outer periphery. The coating pattern 192 generally includes a hydrophobic material (e.g., passivated or silylated silicon dioxide or silicon nitride, or alternatively, an organic photoresist), and may be on a top or uppermost surface of the second micro-lens 182.

The first, second, and third color filters 51, 52, and 53 may be red, green, and blue color filters. The second color filters 52 are provided at sides of the first color filter 51 and/or the third color filter 53. Accordingly, the number of the second color filters 52 may be two times the number of the first color filters 51 or the third color filters 53.

The first and second micro-lenses 181 and 182 have a spherical top surface and a square-shaped outer peripheral surface, so that a fill factor and photosensitivity can be improved.

Reference numbers shown in FIG. 16 but not explained above will be described in the exemplary method for manufacturing the image sensor. Hereinafter, the exemplary method for manufacturing an exemplary image sensor according to the second embodiment will be described with reference to FIGS. 8 to 16.

Figure 8:
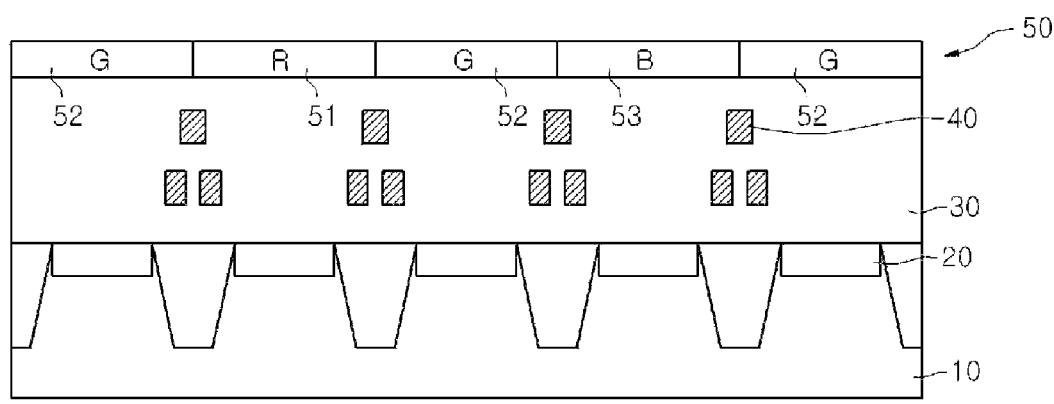
FIGS. 8 to 16 are cross-sectional views showing intermediate structures in an exemplary process of manufacturing an image sensor according to a second embodiment.

Referring to FIG. 8, the color filter array 50 is formed on the semiconductor substrate 10 including the unit pixels 20, generally in the same manner as in the first embodiment. Since the semiconductor substrate 10, the interlayer dielectric layer 30, the metal interconnection 40, and the color filter array 50 are identically employed in the second embodiment as in the first embodiment, details thereof will be omitted.

The color filter array 50 may be formed in order of the second color filter 52 first, the first color filter 51 next, and the third color filter 53 last. In other words, the first and third color filters 51 and 53 may be formed at sides of the second color filter 52.

Figure 9:
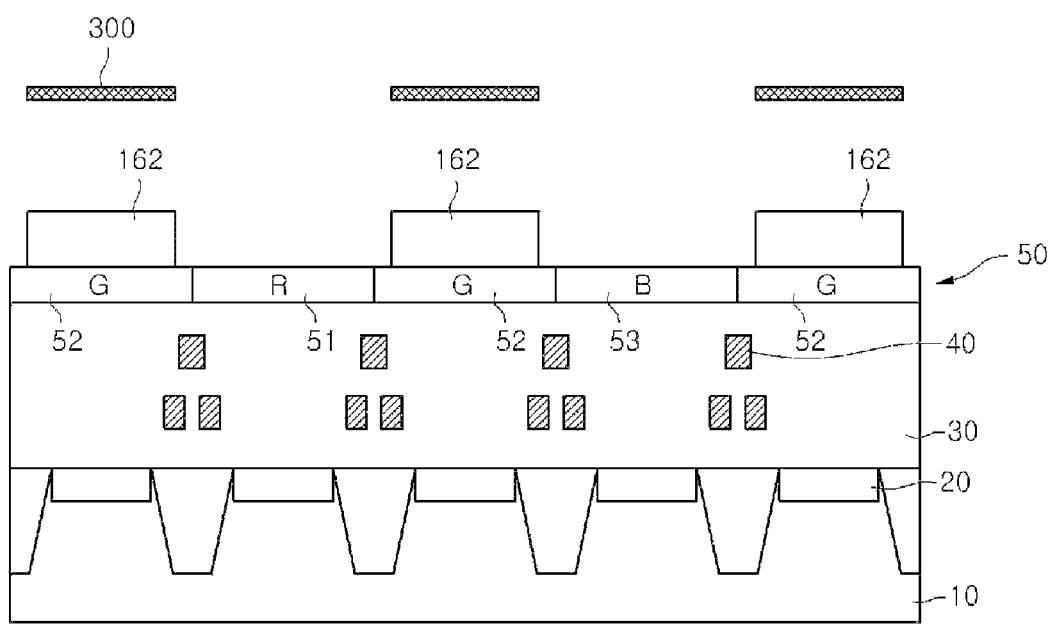

Referring to FIG. 9, a seed pattern 162 may be formed on the second color filter 52. In order to form the seed pattern 162, photoresist for a micro-lens is coated on the color filter array 50 through a spin-on process, thereby forming a photoresist film. Then, after a circular pattern mask 300 is positioned in an area corresponding to the second color filter 52, an exposure and development process is performed, so that the seed pattern 162 is formed on the second color filters 52.

In this case, the seed pattern 162 has a width equal to or narrower than that of the second color filter 52. In addition, the seed pattern 162 may have a circular shape when viewed in a plan or layout view.

Figure 10:
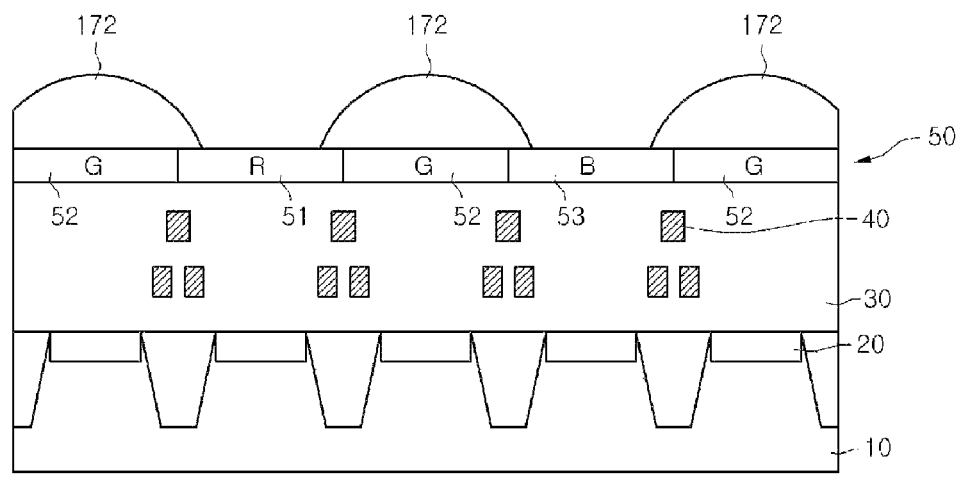

Referring to FIG. 10, a lens pattern 172 is formed on the second color filter 52. The lens pattern 172 may be formed through a thermal reflow process on the seed pattern 162, similar to that described above for the first embodiment.

A reflow process forms a lens surface using surface tension by applying or providing mobility to a polymer material. When the reflow process is performed with respect to the seed pattern 162, the shape of the lens pattern 172 may be determined by the shape of an outer surface and/or a peripheral shape (in a layout view) of the seed pattern 162. In other words, since the seed pattern 162 has a circular shape when viewed in a plan or layout view, the reflow process is performed on the seed pattern 162 so that the semi-spherical lens pattern 172 has a convex surface.

Since the lens pattern 172 is formed through the reflow process, the lens pattern 172 may cover the entire surface of the second color filter 52. In addition, the lens pattern 172 may have a width wider than that of the second color filter 52, so that the lens pattern 172 may be formed to or beyond the border of the first color filter 51 or the third color filter 53.

Since the lens pattern 172 is formed by reflowing the seed pattern 162, the lens pattern 172 may have a uniform radius of curvature in the width, length, and diagonal directions.

Figure 11:
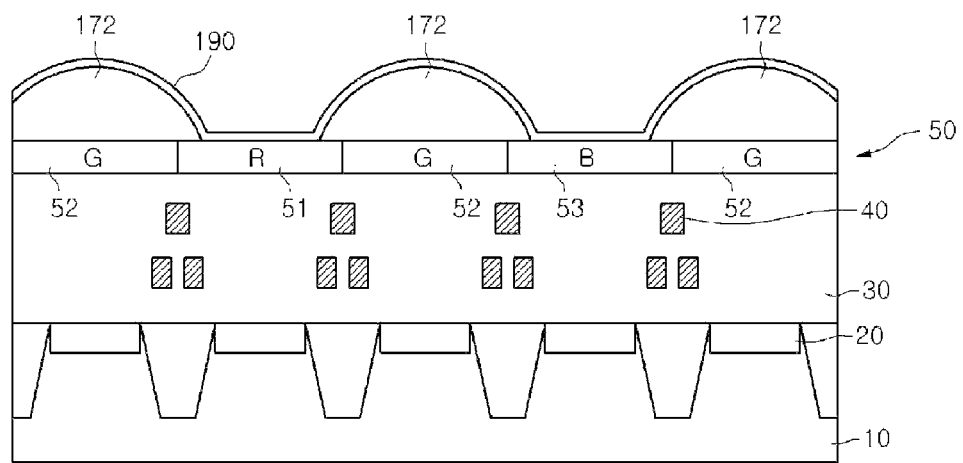

Referring to FIG. 11, a coating layer 190 is formed on the lens pattern 172. The coating layer 190 is formed on the color filter array 50 including the lens pattern 172, so that the surface of the lens pattern 172 and the color filter array 50 can be protected. The coating layer 190 may include a hydrophobic material. For example, the coating layer 190 may be formed by spin-coating a hydrophobic material such as photoresist.

Figure 12:
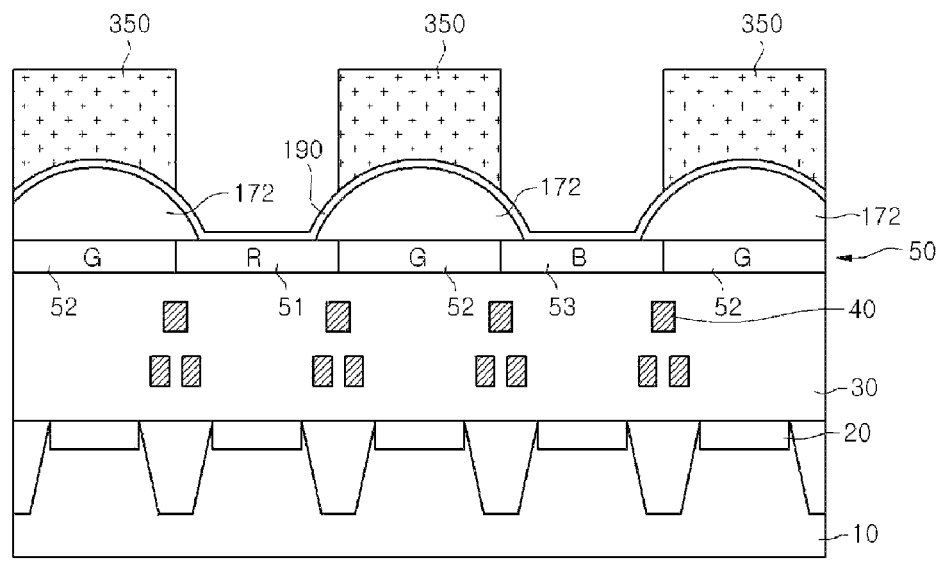

Referring to FIG. 12, a photoresist pattern 350 is formed on the lens pattern 172, generally in the same manner as mask 100 in the first embodiment. The photoresist pattern 350 is formed on the lens pattern 172 corresponding to the second color filter 52, so that the coating layer 190 on or over the first to third color filters 51 and 53 can be exposed. In addition, the photoresist pattern 350 may have the same size and shape as those of the second color filter 52. The photoresist pattern 350 can expose a remaining area except for the lens pattern 172 above or at the upper portion of the second color filter 52.

Figure 13:
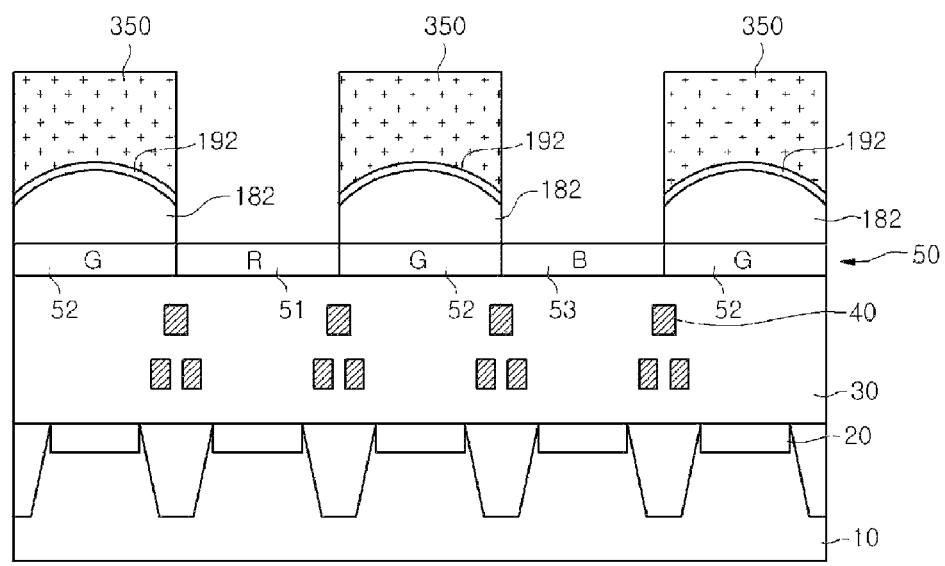
Figure 14:
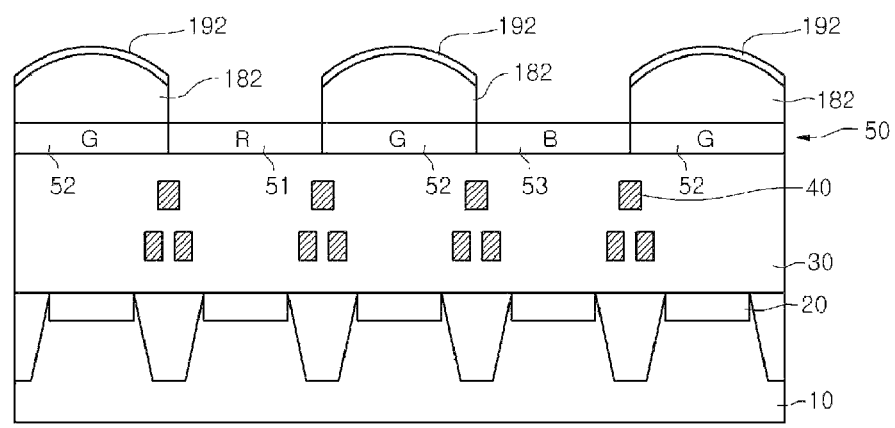

Referring to FIGS. 13 and 14, the micro-lens 182 and the coating pattern 192 are formed on the second color filter 52. The micro-lens 182 has substantially the same size (e.g., at least two dimensions, such as length and width) as that of the second color filter 52. The micro-lens 182 may have a spherical or convex upper surface. In addition, the coating pattern 192 may be formed on only a top surface of the micro-lenses 182.

The exposed portions of the micro-lenses 182 and the coating pattern 192 are removed from the upper portion of (or over) the first and third color filters 51 and 53 using the photoresist pattern 350 as an etching mask. Accordingly, the micro-lenses 182 and the coating pattern 192 are formed only on or over the second color filter 52. Thereafter, the photoresist pattern 350 may be removed through an ashing process.

Therefore, the micro-lenses 182 may have a spherical top surface and square-shaped sidewalls. In other words, when the micro-lenses 182 are viewed in a plan or layout view, the micro-lenses 182 may have the same square shape as that of the second color filters 52.

When the micro-lens of the image sensor has the same radius of curvature in the width, length, and diagonal directions, the photosensitivity of the image sensor can be improved. According to the second embodiment, the micro-lenses 182 generally have a spherical top surface, so that aberrations are reduced to improve the photosensitivity. In addition, the micro-lens 182 has a square-shaped outer periphery that may cover the entire surface of the second color filter 52 so that a fill-factor can be improved.

Figure 15:
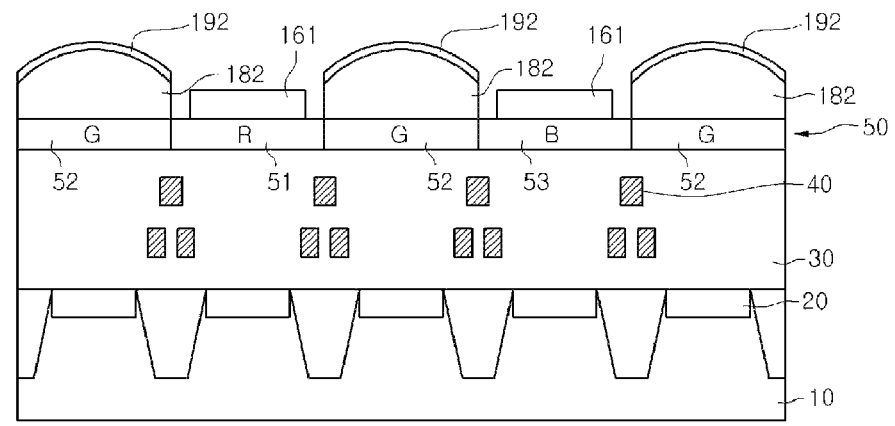

Referring to FIG. 15, another seed pattern 161 is formed on the first and third color filters 51 and 53. In order to form the seed pattern 161, a photoresist for micro-lenses is coated on the color filter array 50 through a spin-on process, thereby forming a photoresist film. Thereafter, the photoresist film is exposed and developed, so that the seed pattern 161 is formed on the first and third color filters 51 and 53. A square mask may be used when the first seed pattern 161 is formed. Meanwhile, the mask for the seed pattern 161 may be identical to that for the seed pattern 162.

Meanwhile, since the coating pattern 192 is formed on a top surface of the micro-lenses 182, deformation of the micro-lenses 182 may be reduced, minimized or prevented when an exposure and development process for the seed pattern 161 is performed.

Referring to FIG. 16, additional micro-lenses 181 are formed on the first and third color filters 51 and 53. The micro-lenses 181 may be formed by performing a reflow process for the first seed pattern 161, generally in the same manner as in the first embodiment. When the reflow process is performed with respect to the seed pattern 161, micro-lenses 181 having a convex spherical upper surface may be formed.

When the reflow process is performed on the seed pattern 161, a reflow material is sufficiently spread on the side surface (s) of the micro-lenses 182. However, if the reflow material arrives at the coating pattern 192 which is on a surface of the microlens 182, the reflow material will not spread any more, but will swell convexly instead. In other words, the coating pattern 192 serves as an anti-reflow layer, so that the micro-lenses 181 do not bridge significantly with the surface of the micro-lenses 182. Accordingly, the micro-lenses 181 have a convex spherical upper surface and a square-shaped outer periphery.

FIG. 17A is a plan view showing the shapes of the micro-lenses 181 and 182 in FIG. 16, and FIG. 17B is a graph showing an exemplary curvature of the microlenses in FIG. 17A.

As shown in FIG. 17A, the micro-lenses 181 and 182 have a spherical or convex top surface, and a square-shaped outer periphery. Accordingly, as shown in FIG. 17B, the micro-lenses 181 and 182 may have a uniform dimensional value in the width, length, and diagonal directions.

In the method for manufacturing the image sensor according to embodiments of the invention, when a "double" lens is manufactured, the lens may have a spherical upper surface and a square outer periphery. Accordingly, the light condensing efficiency can be raised without the loss of a fill factor, so that the photosensitivity can be improved.

In addition, when the second micro-lens is formed, after forming a lens pattern using a circular mask, the outer peripheral surface of the lens can be formed in a square shape.

In addition, a coating layer comprising a hydrophobic material may be formed on the surface of certain micro-lenses, so that the micro-lenses may have a spherical upper surface and an outer peripheral surface in the shape of a square.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a semiconductor substrate including a plurality of unit pixels;
   an interlayer dielectric layer and a metal interconnection on the semiconductor substrate, wherein the interlayer dielectric layer comprises a plurality of dielectric layers, each dielectric layer comprising a lowermost etch stop layer, at least one conformal or gap-fill dielectric layer, at least one bulk dielectric layer, and at least one cap layer;
   first, second and third color filters on or over the semiconductor substrate, the first color filter having a first color, the second color filter having a second color different from the first, and the third color filter having a third color different from the first and the second colors;
   first micro-lenses in physical contact with the first and third color filters, each of the first micro-lenses comprising (i) a lower portion having a square shape and an outer periphery with substantially vertical sidewalls and (ii) an upper portion having a convex shape; and
   second micro-lenses on the second color filters.

2. The image sensor of claim 1, wherein the outer periphery of each of the second micro-lenses has a circular shape.

3. The image sensor of claim 1, wherein the first color filter includes a red color filter, the second color filter includes a green color filter, and the third color filter includes a blue color filter.

4. The image sensor of claim 1, wherein the second color filter is at opposite sides of the first color filter and the third color filter.

5. The image sensor of claim 4, comprising twice as many second color filters as first color filters or third color filters.

6. The image sensor of claim 1, wherein the lower portion of each of the first micro-lenses has a height of 100 to 8000 nm.

7. The image sensor of claim 6, wherein the lower portion of each of the first micro-lenses has a height of 500 to 5000 nm.

8. The image sensor of claim 1, wherein, in a top view, the outer periphery of the lower portion of each of the first micro-lenses has substantially straight segments.

9. The image sensor of claim 8, wherein the substantially straight segments constitute at least half of the entire outer periphery.

10. The image sensor of claim 1, wherein the second color filter is at opposite sides of the first color filter.

11. The image sensor of claim 1, wherein the second color filter is at opposite sides of the third color filter.

12. The image sensor of claim 1, wherein each of the first micro-lenses has a same radius of curvature along its width, length, and diagonal directions.

13. The image sensor of claim 1, wherein the unit pixel comprises a photodiode and a CMOS circuit.

14. The image sensor of claim 13, wherein the CMOS circuit comprises a reset transistor, a select transistor, a drive transistor, and an optional transfer transistor.

15. The image sensor of claim 1, wherein the metal interconnection comprises at least one lowermost adhesive or diffusion barrier layer, at least one bulk conductive layer, and at least one uppermost adhesive, hillock prevention and/or antireflective coating layer.

16. The image sensor of claim 1, further comprising a lowermost metal interconnection electrically connected to a source/drain terminal.

17. The image sensor of claim 1, wherein each of the second micro-lenses comprises (i) a lower portion having a square shape and an outer periphery with substantially vertical sidewalls and (ii) an upper portion having a convex shape.

* * * * *